United States Patent
Naik et al.

(10) Patent No.: US 10,381,554 B2
(45) Date of Patent: Aug. 13, 2019

(54) INTEGRATED CIRCUITS WITH MAGNETIC TUNNEL JUNCTIONS AND METHODS FOR FABRICATING THE SAME

(71) Applicant: Globalfoundries Singapore Pte. Ltd., Singapore (SG)

(72) Inventors: Vinayak Bharat Naik, Singapore (SG); Kazutaka Yamane, Singapore (SG); Seungmo Noh, Singapore (SG); Kangho Lee, Singapore (SG); Dimitri Houssameddine, Singapore (SG); Taiebeh Tahmasebi, Singapore (SG); Chenchen Jacob Wang, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 2 days.

(21) Appl. No.: 15/700,225

(22) Filed: Sep. 11, 2017

(65) Prior Publication Data
US 2019/0081234 A1    Mar. 14, 2019

(51) Int. Cl.
| H01L 27/22 | (2006.01) |
| H01L 43/02 | (2006.01) |
| H01L 43/08 | (2006.01) |
| H01L 43/10 | (2006.01) |
| H01L 43/12 | (2006.01) |

(52) U.S. Cl.
CPC ............ *H01L 43/08* (2013.01); *H01L 27/226* (2013.01); *H01L 43/02* (2013.01); *H01L 43/10* (2013.01); *H01L 43/12* (2013.01)

(58) Field of Classification Search
None
See application file for complete search history.

(56) References Cited

U.S. PATENT DOCUMENTS

| 2007/0002504 A1* | 1/2007 | Huai | G11C 11/16 360/324.12 |
| 2008/0124581 A1* | 5/2008 | Miura | B82Y 10/00 428/811.1 |
| 2008/0191295 A1* | 8/2008 | Ranjan | B82Y 25/00 257/421 |
| 2012/0106006 A1* | 5/2012 | Araki | B82Y 25/00 360/244 |
| 2013/0075845 A1* | 3/2013 | Chen | G11C 11/161 257/421 |

FOREIGN PATENT DOCUMENTS

WO    2016105665 A1    6/2016

* cited by examiner

*Primary Examiner* — Thien F Tran
(74) *Attorney, Agent, or Firm* — Lorenz & Kopf, LLP

(57) ABSTRACT

Integrated circuits and methods for fabricating integrated circuits are provided. In one example, an integrated circuit includes a magnetic tunnel junction. The magnetic tunnel junction includes a fixed layer structure, a free layer structure, and a barrier layer disposed between the fixed layer structure and the free layer structure. The fixed layer structure includes a first magnetic layer and a second magnetic layer that is disposed between the first magnetic layer and the barrier layer. The first magnetic layer is configured to produce a first magnetic moment that substantially correlates to a second magnetic moment of the second magnetic layer as a function of temperature.

20 Claims, 5 Drawing Sheets

INTEGRATED CIRCUITS WITH MAGNETIC TUNNEL JUNCTIONS AND METHODS FOR FABRICATING THE SAME

TECHNICAL FIELD

The technical field generally relates to integrated circuits with magnetic tunnel junctions (MTJs), and more particularly relates to integrated circuits with MTJs having enhanced data retention over a relatively broad temperature range and methods for fabricating such integrated circuits.

BACKGROUND

Magnetoresistive Random Access Memory (MRAM) is an emerging technology that may be competitive with prior integrated circuit memory technologies, such as floating gate technology. The MRAM technology may integrate silicon-based electronic components with magnetic tunnel junction technology. A significant element in MRAM is the magnetic tunnel junction (MTJ) where information may be stored. The MTJ stack has at least two magnetic layers separated by a non-magnetic barrier, where a fixed layer (e.g., reference layer) has a set magnetic property and a free layer (e.g., storage layer) has a programmable magnetic property for storing information. If the fixed layer and the free layer have parallel magnetic poles, the resistance through the MTJ stack is measurably less than if the fixed layer and the free layer have anti-parallel poles, so parallel magnetic poles may be read as a "0" and anti-parallel poles may be read as a "1." The MTJ stack is typically incorporated into a memory cell, and many memory cells with MTJ stacks are incorporated into a memory bank.

The magnetic properties of the free layer are changed when the memory cell is programmed, where the alignment of the free layer magnetic properties is switched or changed relative to the fixed layer magnetic properties in the programming process. Programming changes the magnetic properties of the free layer relative to the fixed layer from anti-parallel to parallel, or from parallel to anti-parallel. The programming process typically includes applying a charge (e.g., voltage) across the MTJ stack such that a programming current passes through the MTJ stack.

Thermal stability of the MTJ stack for retaining stored information in the free layer is dependent on an energy barrier of the free layer of the MTJ stack, where higher energy barriers provide greater thermal stability for data retention (e.g., energy barrier$_{(data\_retention)}$>40 kT, where k is Boltzmann's constant and T is temperature). The energy barrier of the free layer should be sufficiently high to maintain thermal stability, for example, from about room temperature (e.g., about 25° C.) to packaging reflow process temperatures (e.g., solder reflow process temperatures of about 260° C.). To achieve relatively high switching efficiency and data retention over a desired temperature range, the stray field from the fixed layer acting on the free layer should be relatively low over the temperature range. However, many conventional fixed layer materials have magnetic moments that are very temperature dependent, producing at various temperatures, for example, at or near packaging reflow process temperatures, a significant stray field from the fixed layer. As a result of this significant stray field, a relatively high magnetic field coupling strength (Hcpl) at the free layer may be produced that can overcome the energy barrier of the layer, thereby causing data retention issues.

Accordingly, it is desirable to provide integrated circuits with magnetic tunnel junctions having enhanced data retention over a relatively broad temperature range, as compared to traditional magnetic tunnel junctions, and methods for fabricating such integrated circuits. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits are provided. In an exemplary embodiment, an integrated circuit includes a magnetic tunnel junction. The magnetic tunnel junction includes a fixed layer structure, a free layer structure, and a barrier layer disposed between the fixed layer structure and the free layer structure. The fixed layer structure includes a first magnetic layer and a second magnetic layer that is disposed between the first magnetic layer and the barrier layer. The first magnetic layer is configured to produce a first magnetic moment that substantially correlates to a second magnetic moment of the second magnetic layer as a function of temperature.

In another exemplary embodiment, an integrated circuit includes a magnetic tunnel junction. The magnetic tunnel junction includes a fixed layer structure, a free layer structure that includes one or more free layers that are magnetic, and a barrier layer that includes a non-magnetic material. The barrier layer is disposed between the fixed layer structure and the free layer structure. The fixed layer structure includes a first magnetic layer and a second magnetic layer that is disposed between the first magnetic layer and the barrier layer. The first magnetic layer includes one or more temperature sensitive magnetic layers that include boron and one or more of cobalt or iron. Boron is present in the one or more temperature sensitive magnetic layers in an amount of from about 1 to about 30 atomic percent.

In another exemplary embodiment, an integrated circuit includes a magnetic tunnel junction that includes a fixed layer structure. A free layer structure includes one or more free layers that are magnetic. A barrier layer includes a non-magnetic material and is disposed between the fixed layer structure and the free layer structure. The fixed layer structure includes a first magnetic layer and a second magnetic layer that is disposed between the first magnetic layer and the barrier layer. The first magnetic layer includes one or more ferromagnetic materials and one or more non-magnetic materials. The one or more ferromagnetic materials include cobalt, iron, nickel, or a combination thereof The one or more non-magnetic materials include tantalum, molybdenum, tungsten, boron, titanium, vanadium, hafnium, ruthenium, or a combination thereof.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

The exemplary embodiments taught herein provide an integrated circuit that includes a magnetic tunnel junction. The magnetic tunnel junction includes a fixed layer structure, a free layer structure, and a barrier layer disposed between the fixed layer structure and the free layer structure. The free layer structure includes one or more free layers that are magnetic and the barrier layer includes a non-magnetic material. The fixed layer structure includes a first magnetic layer and a second magnetic layer that is disposed between the first magnetic layer and the barrier layer.

The first magnetic layer is configured to produce a first magnetic moment that substantially correlates to a second magnetic moment of the second magnetic layer as a function of temperature in response to an applied voltage. With the substantial correlation between the respective magnetic moments, and without being bound by theory, it is believed that any stray field produced from the second magnetic layer is substantially canceled or prevented from acting on the free layer structure. In an exemplary embodiment, by substantially canceling or preventing a stray field from acting on the free layer structure, it has been found that the free layer structure can maintain a magnetic field coupling strength (Hcpl) from about 0 to about 100 Oersted (Oe) from about ambient temperature to a reflow temperature to enhance switching efficiency and data retention of the magnetic tunnel junction.

Figure 1:
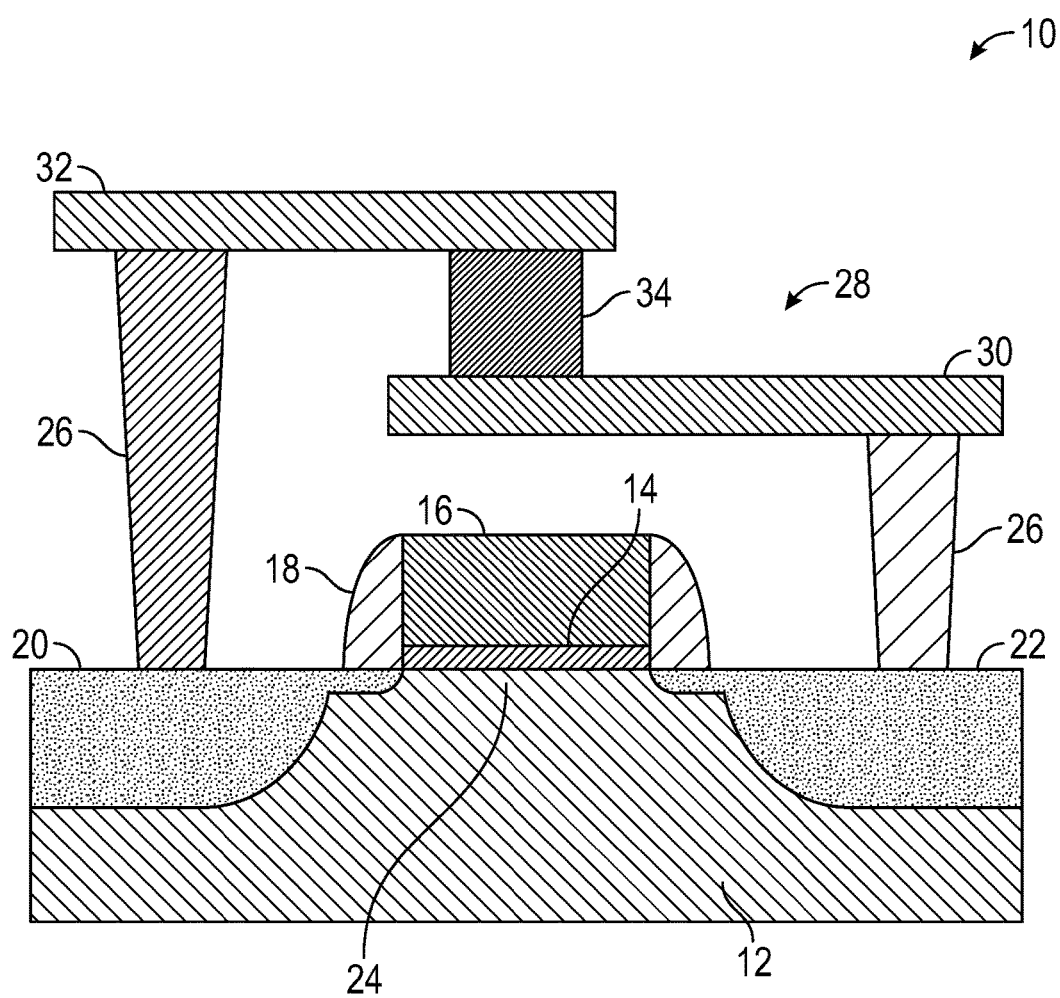
FIG. 1 illustrates, in cross sectional view, an integrated circuit including a magnetic tunnel junction in accordance with exemplary embodiments.

FIG. 1 illustrates, in cross sectional view, an integrated circuit 10 in accordance with exemplary embodiments. The integrated circuit 10 includes a substrate 12 formed of a semiconductor material. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. As referred to herein, a material that includes a recited element/compound includes the recited element/compound in an amount of at least about 1 weight percent or more based on the total weight of the material unless otherwise indicated. In many embodiments, the substrate 12 primarily includes a monocrystalline semiconductor material. The substrate 12 may be a bulk silicon wafer (as illustrated) or may be a thin layer of silicon on an insulating layer (commonly known as silicon-on-insulator or SOI, not illustrated) that, in turn, is supported by a carrier wafer. The substrate 12 has a substrate surface, and the substrate surface may be used as a reference for various components described herein.

A gate insulator 14 overlies the substrate 12, and a gate 16 overlies the gate insulator 14. As used herein, the term "overlying" means "over" such that an intervening layer may lie between the gate insulator 14 and the substrate 12, or "on" such that the gate insulator 14 physically contacts the substrate 12. In an exemplary embodiment, the gate insulator 14 includes an electrically insulating material and the gate 16 includes an electrically conductive material. As used herein, an "electrically insulating material" is a material with a resistivity of about $1\times10^4$ ohm meters or more, an "electrically conductive material" is a material with a resistivity of about $1\times10^{-4}$ ohm meters or less, and an "electrically semiconductive material" is a material with a resistivity of from about more than $1\times10^{-4}$ ohm meters to less than about $1\times10^4$ ohm meters. For example, the gate insulator 14 may include silicon dioxide and the gate 16 may include polysilicon doped with conductivity determining impurities, but other materials may be used in alternate embodiments. Electrically insulating spacers 18 may overlie the substrate 12 adjacent to the gate insulator 14 and the gate 16, where the spacers 18 are positioned on opposite sides of the gate insulator 14 and the gate 16. The spacers 18 may include silicon dioxide, silicon nitride, or other electrically insulating materials in various embodiments. A source 20 may be formed within the substrate 12 on one side of the gate 16, and a drain 22 may be formed within the substrate 12 on the opposite side of the gate 16. The source 20 and drain 22 include conductivity determining impurities (sometimes referred to as "dopants") at a higher concentration than in the substrate 12. FIG. 1 illustrates a planar transistor 28, where the transistor 28 includes the gate insulator 14, the gate 16, the spacers 18, the source 20, the drain 22, and a channel 24 disposed within the substrate 12 between the source 20 and drain 22 and underlying the gate 16. However, finned field effect transistors (not illustrated), transistors with the source and drain formed overlying the substrate (not illustrated), or other types of transistors 28 may be used in alternate embodiments.

In the illustrated embodiment, a bottom electrode 30 is in electrical communication with the drain 22, and a top electrode 32 is in electrical communication with the source 20. A contact 26 may be used to electrically connect the source 20 and drain 22 with the top and bottom electrodes 32, 30, respectively. The term "electrical communication," as used herein, means electrical current is capable of flowing from one component to another, where the electrical current may or may not flow through an electrically conductive or semiconductive intervening component. The term "direct electrical contact," as used herein, means direct physical contact between components that are electrically conductive or semiconductive, but not electrically insulating. A magnetic tunnel junction 34 (MTJ) is positioned between the bottom and top electrodes 30, 32, where the MTJ 34 is in electrical communication with the bottom and top electrodes 30, 32. In an exemplary embodiment, the bottom electrode 30 may serve as a word line, and the top electrode 32 may serve as a bit line, but other embodiments are also possible. The bottom and top electrodes 30, 32 may include several layers (not illustrated,) such as a seed layer, a core, and a cover, and may include tantalum, tantalum nitride, nickel, copper, aluminum, or other electrically conductive materials. The MTJ 34 and the bottom and top electrodes 30, 32 may also be connected to other electronic components instead of the transistor 28, or in addition to the transistor 28 in various embodiments.

Figure 2:
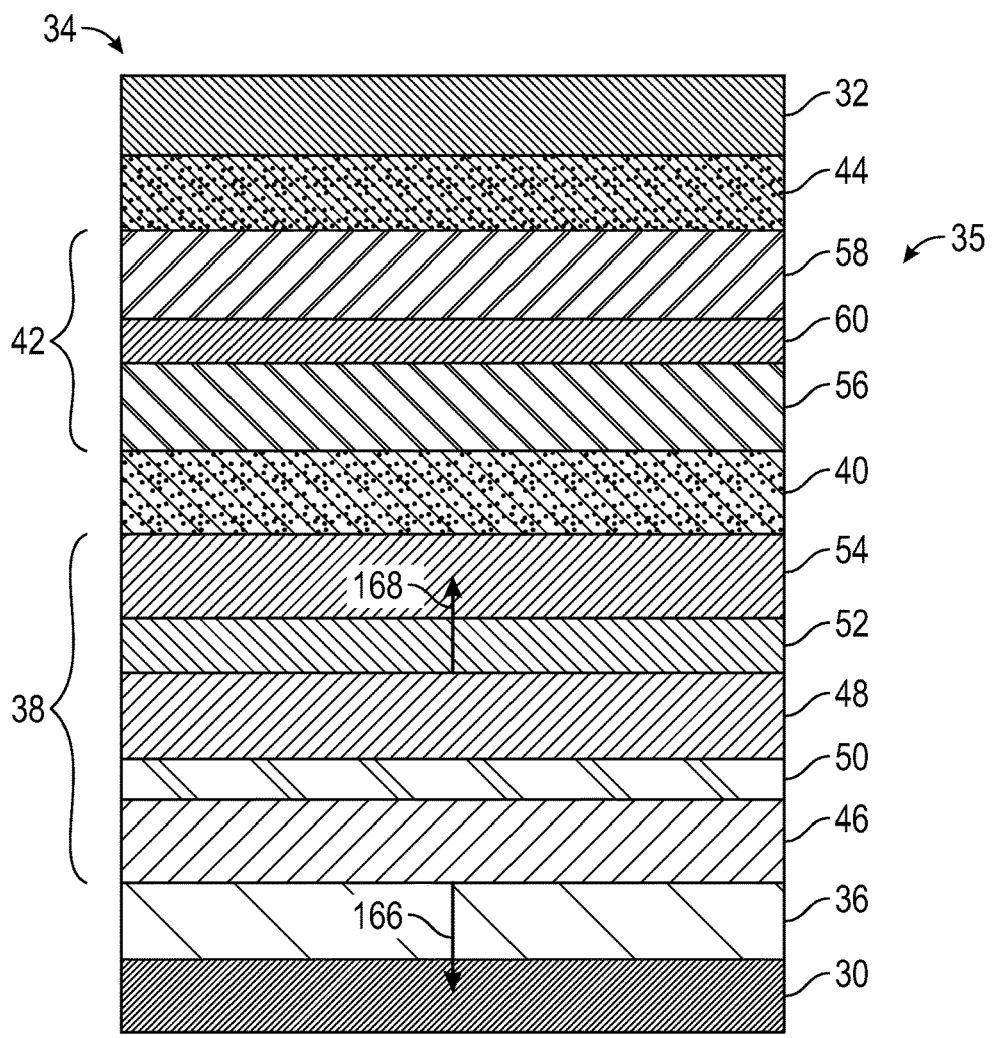
FIG. 2 illustrates, in cross-sectional view, a magnetic tunnel junction in accordance with an exemplary embodiment.

Referring FIG. 2, in an exemplary embodiment, the MTJ 34 includes several layers overlying each other that form a stack 35 (e.g., MTJ stack). The illustrated layers of the MTJ 34 may include sub-layers in some embodiments and additional layers may also be present. In an exemplary embodiment, a seed layer 36 overlies the bottom electrode 30, a fixed layer structure 38 overlies the seed layer 36, a barrier layer 40 overlies the fixed layer structure 38, a free layer structure 42 overlies the barrier layer 40, a capping layer 44 overlies the free layer structure 42, and the top electrode 32 overlies the capping layer 44.

As illustrated, the fixed layer structure 38 includes magnetic layers 46 and 48 (also referred to as "hard metal layer(s)") that overlie the bottom electrode 30, a fixed divider layer 50 is disposed between the magnetic layers 46 and 48, a transition layer 52 overlies the magnetic layer 48, and a reference layer 54 overlies the transition layer 52 and is disposed between the barrier layer 40 and the magnetic layer 48. The magnetic layers 46 and 48 are magnetic and the fixed divider layer 50 is non-magnetic. As used herein, a layer or material is "magnetic" if it is a ferromagnetic material, where the term "ferromagnetic" does not require the presence of iron. More particularly, a material is "magnetic" if it is a permanent magnet that retains its magnetic field after an induction magnetic field is removed, where the permanent magnet has a residual flux density of about 0.1 tesla or more. A layer or material is "non-magnetic" if it is a diamagnetic or a paramagnetic material, and more particularly does not form a permanent magnet or is only capable of forming a permanent magnet that has a residual flux density of less than about 0.1 tesla or less. A "permanent" magnet is a magnet that has residual flux density of about 0.1 tesla or more for at least about 1 week or more after being removed from an induction magnetic field. The transition layer 52 is non-magnetic and the reference layer 54 is magnetic in an exemplary embodiment.

In an exemplary embodiment, the seed layer 36 includes two or more of nickel, chromium, ruthenium, and platinum, and may also include other materials. In an exemplary embodiment and as will be discussed in further detail below, the magnetic layer 46 includes boron with cobalt (e.g., cobalt or cobalt compounds/alloys) and/or boron with iron (e.g., iron or iron compounds/alloys); and the magnetic layer 48 in various embodiments includes cobalt (e.g., cobalt or cobalt compounds/alloys), iron (e.g., iron or iron compounds/alloys), cobalt platinum compounds, cobalt nickel compounds, cobalt iron compounds, manganese platinum compounds, or other materials. The fixed divider layer 50 primarily includes one or more of ruthenium, iridium, rhodium, chromium, or nickel; the transition layer 52 primarily includes one or more of tantalum, tungsten, or molybdenum; and the reference layer 54 primarily includes cobalt, iron, and boron. However, other materials may be used in alternate embodiments. In an exemplary embodiment, the seed layer 36, the first and second magnetic layers 46 and 48, the fixed divider layer 50, the transition layer 52, and the reference layer 54 are formed by sputtering or by ion beam deposition using the materials of the various layers, but other deposition techniques may also be used.

As discussed above, the barrier layer 40 is formed overlying the fixed layer structure 38, where the barrier layer 40 includes magnesium oxide in an exemplary embodiment. The barrier layer 40 and the remaining layers 42 and 44 in the MTJ 34 may be formed by sputtering, by ion beam deposition, or by other techniques in various embodiments. An additional barrier layer (not illustrated) or other layers may also be included in the MTJ 34 in various embodiments. The capping layer 44 is a non-magnetic layer that may include ruthenium, hafnium, molybdenum, tungsten, platinum, nickel, or other compounds.

The free layer structure 42 includes a plurality of individual free layers 56 and 58 separated by a spacer layer(s) 60. In the illustrated embodiment, the free layer structure 42 includes a first free layer 56 that is a magnetic layer, and a spacer layer 60 overlying the first free layer 56, where the first spacer layer 60 is non-magnetic. A second free layer 58 overlies the spacer layer 60, where the second free layer 58 is a magnetic layer. In an exemplary embodiment, the first and second free layers 56 and 58 include cobalt, iron, boron, and/or nickel and may include other free layer additional element. The spacer layer 60 includes a non-magnetic material such that the spacer layer 60 is non-magnetic. In an exemplary embodiment, the spacer layer 60 can includes one or more of titanium, vanadium, chromium, zirconium, niobium, molybdenum, hafnium, tantalum, tungsten, and aluminum.

Figure 4:
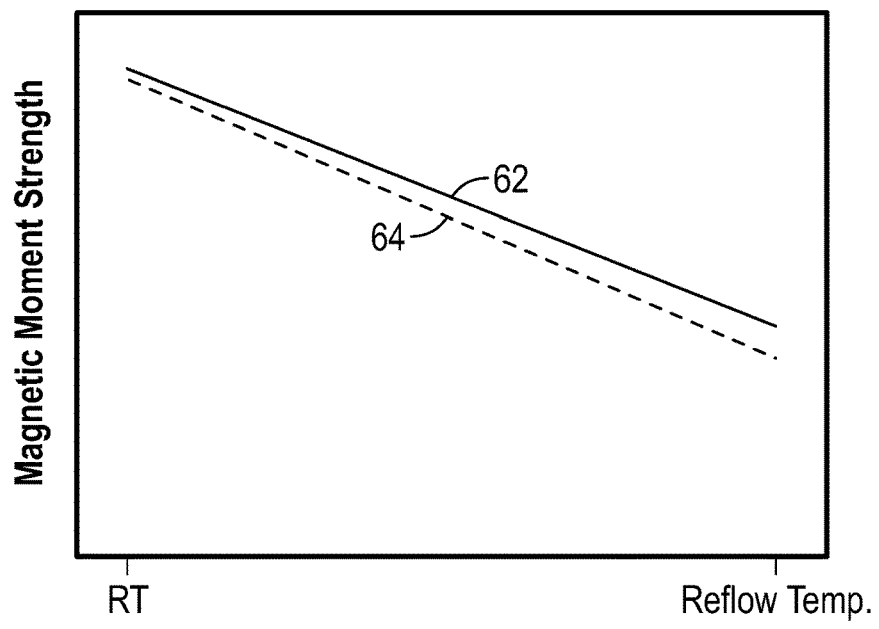
FIG. 4 is a graphical representation of magnetic moments of two different magnetic layers of a magnetic tunnel junction in accordance with exemplary embodiment.

FIG. 4 is a graphical representation of the magnetic moments produced from the magnetic layers 46 and 48 as a function of temperature in which the Y-axis is magnetic moment strength and the X-axis is temperature. Referring to FIGS. 1-2 and 4, the magnetic layers 46 and 48 correspondingly produce magnetic moments 62 and 64 as a function of temperature. In an exemplary embodiment, and as will be discussed in further detail below, the magnetic layer 46 is configured to produce the magnetic moment 62 so as to substantially correlate to the magnetic moment 64 of the magnetic layer 48 from about ambient temperature to about a process reflow temperature in response to an applied voltage (e.g., voltage sufficient for producing a programming current through the MTJ 34) to the MTJ 34 to substantially cancel any stray field from the magnetic layer 48 that might otherwise act on the free layer structure 42. The term "substantially correlate(s)" as used herein is understood to mean that the referenced values match or are within about 10%, such as within about 5%, for example within about 1% as measured using conventional diagnostic equipment. In an exemplary embodiment, ambient temperature is from about 20 to about 30° C., such as from about 23 to about 27° C., for example about 25° C., and the process reflow temperature is from about 240 to about 280° C., such as from about 250 to about 270° C., for example about 260° C.

In particular and as illustrated, the magnetic moment 62 of the magnetic layer 46 decreases as a function of increasing temperature at a first rate and the magnetic moment 64 of the magnetic layer 48 decreases as a function of increasing temperature such that the first and second rates substantially match each other from about ambient temperature to the process reflow temperature. However, because of the positioning of the magnetic layers 46 and 48 in the MTJ stack 35, specifically with the magnetic layer 48 positioned closer to the barrier layer 40 and the free layer structure 42, and the magnetic layer 46 positioned on an opposing side of the fixed divider layer 50 spaced apart from the magnetic layer 48 and away from barrier layer 40 and the free layer structure 42, the magnetic moments 62 and 64 act in opposing directions (indicated by single-headed arrows 166 and 168, respectively). As such, in an exemplary embodiment, the magnetic moments 62 and 64 cancel or substantially cancel each other out (e.g., resultant of the magnetic moments 62 and 64) such that any stray field from the magnetic layer 48 is canceled (e.g., zero (0)) or substantially canceled (e.g., of nominal value) to maintain a relatively low and/or constant magnetic field coupling strength (Hcpl) at the free layer structure 42 over the relatively broad temperature range.

In an exemplary embodiment, the magnetic field coupling strength (Hcpl) of the free layer structure is maintained from about 0 to about 100 Oersted (Oe), such as from about 0 to about 50 Oe, such as from about 0 to about 25, for example about 0 from about ambient temperature to the process reflow temperature. It has been found that by maintaining a relatively low and/or constant magnetic field coupling strength at the free layer structure 42 from about ambient temperature to the process reflow temperature, switching efficiency and/or data retention of the MTJ 34 is enhanced over this temperature range.

As discussed above, the magnetic layer 46 includes boron and one or more of cobalt or iron. Referring to FIGS. 1-4, in an exemplary embodiment, the magnetic layer 46 includes one or more temperature sensitive magnetic layers 66, 68, and 70 that include boron and one or more of cobalt or iron. In particular, the temperature sensitive magnetic layers 66, 68, and 70 are magnetic layers that produce the magnetic moment 62 which decreases as a function of increasing temperature as discussed above. In an exemplary embodiment, the temperature sensitive magnetic layers 66, 68, and 70 include boron present in an amount of from about 1 to about 30 atomic percent, such as from about 10 to about 30 atomic percent, such as from about 13 to about 30 atomic percent, for example from about 15 to about 30 atomic percent.

The magnetic layer 48 may have the same or similar composition as the magnetic layer 46 or may have a substantially different composition than the magnetic layer 46. In an exemplary embodiment, the magnetic layer 48 includes at least one temperature sensitive magnetic layer that include boron and one or more of cobalt or iron. In particular, the temperature sensitive magnetic layer of the magnetic layer 48 is a magnetic layer(s) that produce the magnetic moment 64 which decreases as a function of increasing temperature as discussed above. In an exemplary embodiment, the temperature sensitive magnetic layer of the magnetic layer 48 include boron present in an amount of from about 1 to about 15 atomic percent. In an exemplary embodiment, the concentration of boron present in the temperature sensitive magnetic layers 66, 68, and 70 is greater than the concentration of boron present in the temperature sensitive magnetic layer of the magnetic layer 48. In one example, boron is present in the temperature sensitive magnetic layer of the magnetic layer 48 in an amount of from about 10 to about 30 atomic percent, for example about 10 to about 13 atomic percent, and boron is present in the temperature sensitive magnetic layers 66, 68, and 70 in an amount of from about 10 to about 30 atomic percent, for example 15 to about 30 atomic percent.

In an exemplary embodiment, the magnetic layer 46 has a greater thickness than the magnetic layer 48. In one example, the magnetic layer 46 has a thickness of from about 20 to about 50 Å, and the magnetic layer 48 has a thickness of from about 1 to about 5 nm, for example from about 1.5 to about 6 Å.

Figure 3:
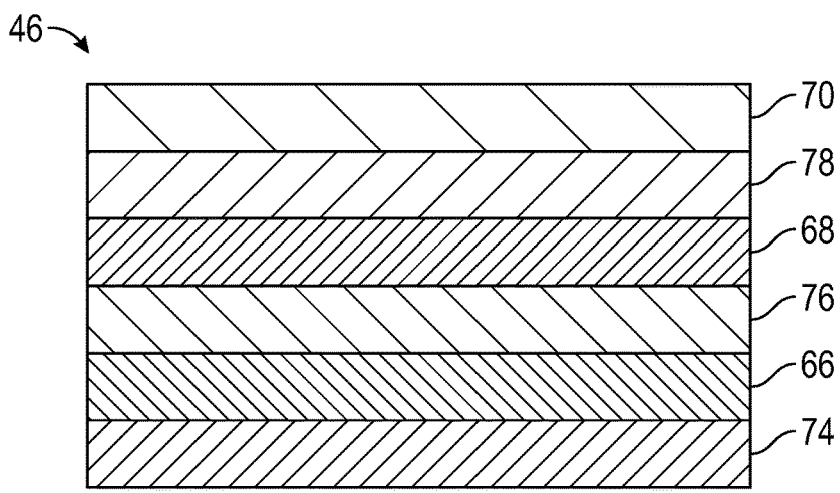
FIG. 3 illustrates, in cross-sectional view, a magnetic layer of the magnetic tunnel junction depicted in FIG. 2 in accordance with an exemplary embodiment.

Referring to FIG. 3, the magnetic layer 46 may include one or more perpendicular magnetic anisotropy (PMA) layers 74, 76, and 78 adjacent to the one or more temperature sensitive magnetic layers 66, 68, and 70. A PMA layer is herein understood to be a layer having a relatively high PMA value. Layers with higher PMA values help decrease the required current to program the free layer (e.g., free layer structure 42) of an MTJ. Moreover, higher PMA values can also help produce a lower damping constant, where a lower damping constant is also associated with a reduced current required for programming. In an exemplary embodiment, the PMA layers 74, 76, and 78 include cobalt, iron, and/or platinum, and are substantially free of boron. In an exemplary embodiment and as illustrated, the layers of the MTJ 34 are arranged in the stack 35 such that the temperature sensitive magnetic layers 66, 68, and 70 and the PMA layers 74, 76, and 78 alternate in which the temperature sensitive magnetic layers 66 and 68 are separated by the PMA layer 76 and the temperature sensitive magnetic layers 68 and 70 are separated by the PMA layer 78. In an exemplary embodiment, the temperature sensitive magnetic layers 66, 68, and 70 each have a thickness of from about 1.5 to about 10 Å, and the PMA layers 74, 76, and 78 each have a thickness of from about 1.5 to about 10 Å.

Figure 5:
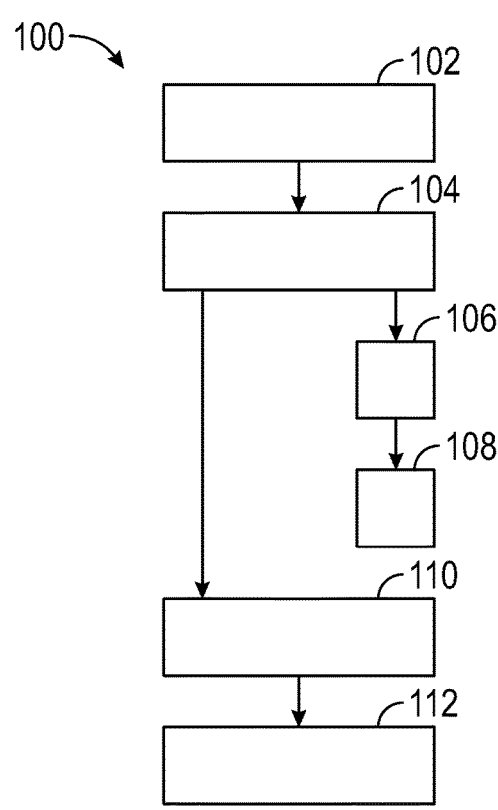
FIG. 5 is a flowchart of a method for fabricating an integrated circuit including a magnetic tunnel junction in accordance with an exemplary embodiment.

Referring to FIG. 5, a method 100 for fabricating an integrated circuit is provided. In an exemplary embodiment, the method 100 includes forming a magnetic tunnel junction (step 102). The magnetic tunnel junction is formed by forming a fixed layer structure (step 104). The fixed layer structure is formed by forming a first magnetic layer (step 106) including one or more temperature sensitive magnetic layers that include boron and one or more of cobalt or iron. In an exemplary embodiment, boron is present in the one or more temperature sensitive magnetic layers in an amount of from about 1 to about 30 atomic percent. A second magnetic layer is formed (step 108) overlying the first magnetic layer. A barrier layer is formed (step 110) overlying the fixed layer structure. The barrier layer includes a non-magnetic material. A free layer structure is formed (step 112) overlying the barrier layer. The free layer structure includes one or more free layers that are magnetic.

Figure 6:
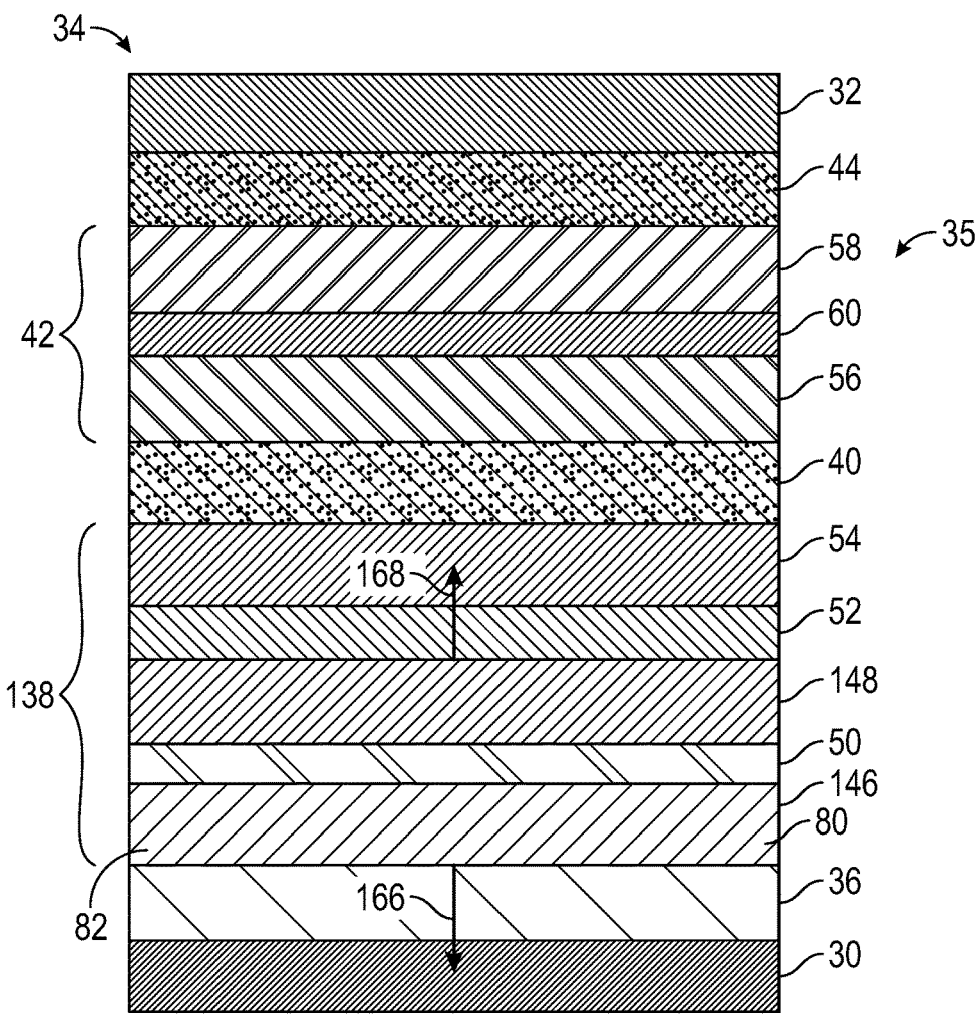
FIG. 6 illustrates, in cross-sectional view, a magnetic tunnel junction in accordance with another exemplary embodiment.

Referring to FIG. 6, in another exemplary embodiment, the MTJ 34 includes several layers overlying each other that form the stack 35 (e.g., MTJ stack) as discussed in relation to FIG. 2 including the seed layer 36, the fixed divider layer 50, the transition layer 52, the reference layer 54, the barrier layer 40, the free layer structure 42 including the layers 56, 58, and 60, and the capping layer 44 but with the exception that the magnetic layers 146 and/or 148 may differ from the magnetic layers 46 and/or 48 as discussed above. In particular, the magnetic layers 146 and 148 are magnetic and correspondingly produce the magnetic moments 62 and 64 as a function of temperature. The magnetic layer 146 is configured to produce the magnetic moment 62 so as to substantially correlate to the magnetic moment 64 of the magnetic layer 148 from about ambient temperature to about a process reflow temperature in response to an applied voltage (e.g., voltage sufficient for producing a programming current through the MTJ 34) to the MTJ 34 to substantially cancel any stray field from the magnetic layer 148 that might otherwise act on the free layer structure 42. As such, in an exemplary embodiment, the magnetic moments 62 and 64 cancel or substantially cancel each other out (e.g., resultant of the magnetic moments 62 and 64) such that any stray field from the magnetic layer 148 is canceled (e.g., zero (0)) or substantially canceled (e.g., of nominal value) to maintain a relatively low and/or constant magnetic field coupling strength at the free layer structure 42 over the relatively broad temperature range.

In an exemplary embodiment, the magnetic layer 146 includes a ferromagnetic material(s) and a non-magnetic material(s) that is present in the magnetic layer 146 such that the magnetic layer 146 overall has temperature sensitive magnetic properties that produce the magnetic moment 62 which decreases as a function of increasing temperature as discussed above. Non-limiting examples of ferromagnetic materials include cobalt, iron, nickel, and/or the like. Non-limiting examples of nonmagnetic materials include tantalum, molybdenum, tungsten, boron, titanium, vanadium, hafnium, ruthenium, and/or the like. In one example, the nonmagnetic material is molybdenum, tungsten, or boron, for example, molybdenum or tungsten. The ferromagnetic materials in the nonmagnetic materials may be combined, for example, as an alloy, a ferromagnetic material(s) doped with a nonmagnetic material(s), a nonmagnetic material(s) doped with a ferromagnetic material(s), and/or as discrete layers of various combinations of ferromagnetic materials and non-magnetic materials.

In an exemplary embodiment and as illustrated in FIG. 6, the magnetic layer 146 is a temperature sensitive layer 80. In one example, the temperature sensitive layer 80 is a temperature sensitive magnetic layer 82 that includes the ferromagnetic material(s) alloyed or doped with the nonmagnetic material(s) such as a cobalt-based alloy, an iron-based alloy, and/or a nickel-based alloy with tantalum, molybdenum, tungsten, boron, titanium, vanadium, hafnium, and/or ruthenium. In a particular example, the temperature sensitive magnetic layer 82 is an alloy of cobalt-iron-boron. In another example, the temperature sensitive magnetic layer 82 is cobalt or a cobalt-based alloy, iron or an iron-based alloy, and/or nickel or a nickel-based alloy that is doped with tantalum, molybdenum, tungsten, boron, titanium, vanadium, hafnium, and/or ruthenium. In a particular example, the temperature sensitive magnetic layer 82 is cobalt or a cobalt-based alloy and/or iron or an iron-based alloy that is doped with boron (e.g., CoFeB). In an exemplary embodiment, the nonmagnetic material(s) is present in the temperature sensitive layer 82 in an amount of from about 10 to about 90 atomic percent, such as from about 20 to about 80 atomic percent, such as from about 30 to about 50 atomic percent, such as from about 35 to about 45 atomic percent, for example about 40 atomic percent.

As discussed above, the magnetic layer 148 is magnetic and produces the magnetic moment 64 which decreases as a function of increasing temperature. In an exemplary embodiment, the magnetic layer 148 includes a ferromagnetic material(s), such as, for example, cobalt or a cobalt-based alloy, iron or an iron-based alloy, nickel or a nickel-based alloy, and/or the like. The magnetic layer 148 may be formed of one or more layers (e.g., multiple layers) or a super-lattice(s) of one or more ferromagnetic materials, such as, for example, cobalt/platinum, cobalt/palladium, cobalt/nickel, and/or the like.

In an exemplary embodiment, the magnetic layer 146 has a greater thickness than the magnetic layer 148. In one example, the magnetic layer 146 has a thickness of from about 20 to about 50 Å and the magnetic layer 148 has a thickness of from about 1.5 to about 6 Å.

Figure 7:
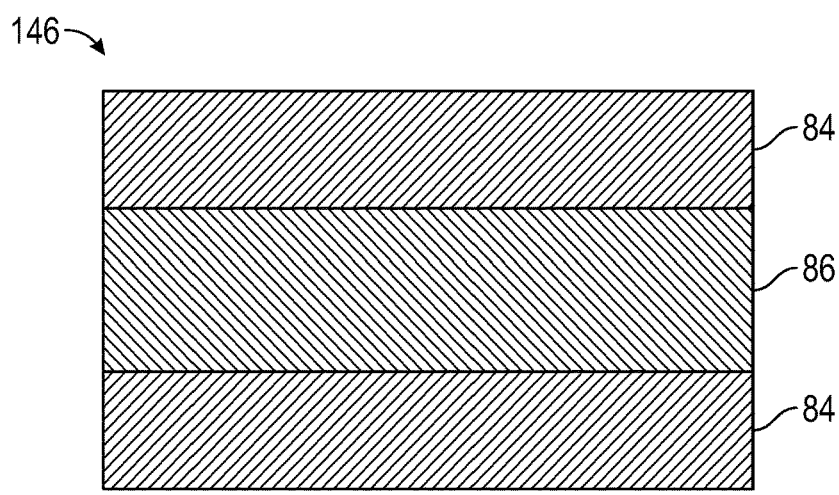
FIG. 7 illustrates, in cross-sectional view, a magnetic layer of the magnetic tunnel junction depicted in FIG. 6 in accordance with an exemplary embodiment.
Figure 8:
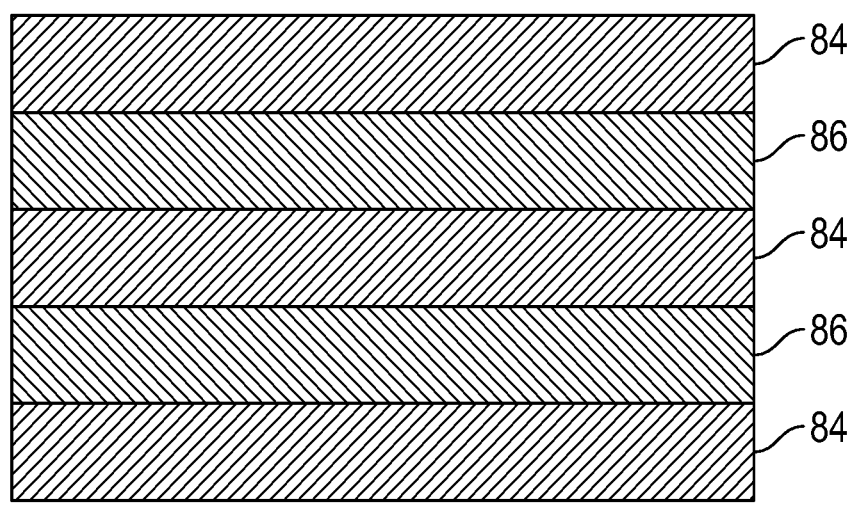
FIG. 8 illustrates, in cross-sectional view, a magnetic layer of the magnetic tunnel junction depicted in FIG. 6 in accordance with an exemplary embodiment.

Referring to FIGS. 6-8, the magnetic layer 146 includes a plurality of layers 84 and 86. The layers of the magnetic layer 146 include PMA layers 84 (or ferromagnetic layers) with a corresponding temperature sensitive layer 86 (or non-magnetic material-containing layer) interposed between two adjacent PMA layers 84. In one example, the magnetic layer 146 includes two PMA layers 84 separated by a single temperature sensitive layer 86 as illustrated in FIG. 7. In another example, the magnetic layer 146 includes three PMA layers 84 separated by two temperature sensitive layer 86 as illustrated in FIG. 8.

The PMA layers 84 include one or more ferromagnetic materials as discussed above and independently, may have the same or different compositions from one another. Likewise, the temperature sensitive layer(s) 86 includes one or more of the nonmagnetic materials as discussed above and independently, may have the same or different compositions from one another if there is more than one temperature sensitive layer 86. In an exemplary embodiment, one of the PMA layers 84 is arranged at the bottom of the magnetic layer 146 and another of the PMA layers 84 is arranged at the top of the magnetic layer 146 such that the seed layer 36 interfaces with the lower PMA layer 84 and the fixed divider layer 50 interfaces with the upper PMA layer 84, respectively. In an exemplary embodiment, the magnetic layer 146 has a thickness of from about 20 to about 50 Å, the PMA layers 84 each have a thickness of from about 1.5 to about 10 Å, and the temperature sensitive layers 86 each have a thickness of from about 10 to about 20 Å.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit comprising:
   a magnetic tunnel junction comprising:
   a fixed layer structure;
   a free layer structure; and
   a barrier layer disposed between the fixed layer structure and the free layer structure, wherein the fixed layer structure comprises a first magnetic layer and a second magnetic layer that is disposed between the first magnetic layer and the barrier layer, wherein the first magnetic layer is configured to produce a first magnetic moment that substantially correlates to a second magnetic moment of the second magnetic layer as a function of temperature.

2. The integrated circuit of claim 1, wherein the first magnetic moment substantially correlates to the second magnetic moment so as to substantially cancel a stray field from the second magnetic layer from acting on the free layer structure to maintain a magnetic field coupling strength (Hcpl) proximate to zero from about ambient temperature to a reflow temperature.

3. The integrated circuit of claim 2, wherein the first magnetic moment of the first magnetic layer decreases as a function of increasing temperature at a first rate and the second magnetic moment of the second magnetic layer decreases as a function of increasing temperature at a second rate that substantially matches the first rate.

4. The integrated circuit of claim 1, wherein the first magnetic layer comprises one or more first temperature sensitive magnetic layers that comprise boron and one or more of cobalt or iron.

5. The integrated circuit of claim 4, wherein boron is present in the one or more first temperature sensitive magnetic layers in an amount of from about 1 to about 30 atomic percent based on the total weight of the one or more first temperature sensitive magnetic layers.

6. The integrated circuit of claim 4, wherein the second magnetic layer comprises one or more second temperature sensitive magnetic layers that comprise boron and one or more of cobalt or iron based on the total weight of the one or more second temperature sensitive magnetic layers.

7. The integrated circuit of claim 6, wherein boron is present in the one or more second temperature sensitive magnetic layers in an amount of from about 10 to about 30 atomic percent.

8. The integrated circuit of claim 6, wherein boron is present in the one or more first temperature sensitive magnetic layers in a concentration greater than boron is present in the one or more second temperature sensitive magnetic layers.

9. The integrated circuit of claim 8, wherein boron is present in the one or more first temperature sensitive magnetic layers in an amount of from about 10 to about 30 atomic percent based on the total weight of the one or more first temperature sensitive magnetic layers.

10. The integrated circuit of claim 1, wherein the first magnetic layer comprises one or more ferromagnetic materials and one or more non-magnetic materials.

11. The integrated circuit of claim 10, wherein the one or more ferromagnetic materials comprise cobalt, iron, nickel, or a combination thereof.

12. The integrated circuit of claim 10, wherein the one or more non-magnetic materials comprise tantalum, molybdenum, tungsten, boron, titanium, vanadium, hafnium, ruthenium, or a combination thereof.

13. The integrated circuit of claim 10, wherein the one or more non-magnetic materials is present in the first magnetic layer in an amount of from about 10 to about 90 atomic percent.

14. An integrated circuit comprising:
   a magnetic tunnel junction comprising:
      a fixed layer structure;
      a free layer structure that comprises one or more free layers that are magnetic; and
      a barrier layer that comprises a non-magnetic material and that is disposed between the fixed layer structure and the free layer structure, wherein the fixed layer structure comprises a first magnetic layer and a second magnetic layer that is disposed between the first magnetic layer and the barrier layer, wherein the first magnetic layer comprises one or more temperature sensitive magnetic layers that comprise boron and one or more of cobalt or iron, wherein boron is present in the one or more temperature sensitive magnetic layers in an amount of from about 1 to about 30 atomic percent, and wherein the first magnetic layer is configured to produce a first magnetic moment that substantially correlates to a second magnetic moment of the second magnetic layer as a function of temperature.

15. The integrated circuit of claim 14, wherein the first magnetic layer further comprises one or more perpendicular magnetic anisotropy (PMA) layers adjacent to the one or more temperature sensitive magnetic layers.

16. The integrated circuit of claim 15, wherein the one or more PMA layers comprise cobalt, iron, and/or platinum.

17. The integrated circuit of claim 16, wherein the one or more PMA layers are substantially free of boron.

18. The integrated circuit of claim 15, wherein the one or more temperature sensitive magnetic layers comprise a plurality of temperature sensitive magnetic layers and the one or more PMA layers comprise a plurality of PMA layers in which individual layers of the first magnetic layer are arranged in a stack with alternating layers of the temperature sensitive magnetic layers and the PMA layers.

19. The integrated circuit of claim 14, wherein the second magnetic layer comprises one or more second temperature sensitive magnetic layers that comprise boron and one or more of cobalt or iron.

20. An integrated circuit comprising:
   a magnetic tunnel junction comprising:
      a fixed layer structure;
      a free layer structure that comprises one or more free layers that are magnetic; and
      a barrier layer that comprises a non-magnetic material and that is disposed between the fixed layer structure and the free layer structure, wherein the fixed layer structure comprises a first magnetic layer and a second magnetic layer that is disposed between the first magnetic layer and the barrier layer, wherein the first magnetic layer comprises one or more ferromagnetic materials and one or more non-magnetic materials, wherein the one or more ferromagnetic materials comprise cobalt, iron, nickel, or a combination thereof and the one or more non-magnetic materials comprise tantalum, molybdenum, tungsten, boron, titanium, vanadium, hafnium, ruthenium, or a combination thereof, and wherein the first magnetic layer is configured to produce a first magnetic moment that substantially correlates to a second magnetic moment of the second magnetic layer as a function of temperature.

* * * * *